(12) United States Patent
Felder et al.

(10) Patent No.: US 9,859,686 B2
(45) Date of Patent: Jan. 2, 2018

(54) LIGHT GUIDING FOR VERTICAL EXTERNAL CAVITY SURFACE EMITTING LASER

(71) Applicant: CAMLIN TECHNOLOGIES (SWITZERLAND) LIMITED, Zurich (CH)

(72) Inventors: Ferdinand Felder, Zurich (CH); Matthias Fill, Zurich (CH); Hans Zogg, Danikon (CH); Pierluigi Debernardi, Turin (IT)

(73) Assignee: Camlin Technologies (Switzerland) Limited, Zurich (CH)

( * ) Notice: Subject to any disclaimer, the term of this patent is extended or adjusted under 35 U.S.C. 154(b) by 0 days.

(21) Appl. No.: 14/787,493

(22) PCT Filed: May 4, 2014

(86) PCT No.: PCT/EP2014/059022
§ 371 (c)(1),
(2) Date: Oct. 28, 2015

(87) PCT Pub. No.: WO2014/180751
PCT Pub. Date: Nov. 13, 2014

(65) Prior Publication Data
US 2016/0104998 A1  Apr. 14, 2016

(30) Foreign Application Priority Data
May 8, 2013 (EP) .................................... 13167055

(51) Int. Cl.
*H01S 5/00* (2006.01)
*H01S 5/183* (2006.01)
(Continued)

(52) U.S. Cl.
CPC .......... *H01S 5/18308* (2013.01); *H01S 5/041* (2013.01); *H01S 5/14* (2013.01);
(Continued)

(58) Field of Classification Search
CPC ............. H01S 5/18308; H01S 5/18344; H01S 5/18397; H01S 5/183; H01S 5/041; H01S 5/423; H01S 5/426; H01S 2301/166
(Continued)

(56) References Cited

U.S. PATENT DOCUMENTS 6,031,858 A * 2/2000 Hatakoshi ........... H01S 5/32341
372/26
2001/0043636 A1* 11/2001 Bewley .................. B82Y 20/00
372/70
(Continued)

FOREIGN PATENT DOCUMENTS

JP  S609187 A  1/1985

OTHER PUBLICATIONS

Springholz G et al: "Molecular beam epitaxy of lead salt-based vertical cavity surface ermtting lasers for the 4-6 mum spectral region". Journal of Crystal Growth, Elsevier, Amsterdam, NL, vol. 227-228, Jul. 1, 2001 (Jul. 1, 2001), pp. 722-728.
(Continued)

Primary Examiner — Kinam Park
(74) Attorney, Agent, or Firm — Burns & Levinson LLP; John C. Serio; Marlo Schepper Grolnic

(57) ABSTRACT

The present invention relates to an active gain layer stack (21) for a vertical emitting laser device, the active gain layer stack (21) comprising a semiconductor material, wherein the semiconductor material is structured such that it forms at least one mesa (24) extending in a vertical direction. A transversally neighboring region (25) that at least partly surrounds said mesa (24) has a second refractive index
(Continued)

($n_2$)—At least part of said mesa (24) has a first refractive index ($n_1$) and a part of the neighboring region (25) transversally adjacent to said part of the mesa (24) has second refractive index (n 2)—Said first refractive index ($n_1$) is higher than said second refractive index ($n_2$) and a diameter in transversal direction of said mesa (24) is chosen such that a transversal confinement factor in the active gain layer stack (21) is increased. The present invention also relates to a laser device including such a stack, further to a method of operation of such a stack, and also to a method of manufacturing of such a stack. The VECSEL comprises a IV-VI semiconductor gain material grown on the lower mirror and an external cavity mirror. A plurality of mesa (22) may be grown on a single substrate (23). Anti-guiding is prevented by the lower refractive index of the surrounding material (25) improving the single transversal mode operation.

14 Claims, 2 Drawing Sheets

(51) Int. Cl.
    *H01S 5/42*     (2006.01)
    *H01S 5/04*     (2006.01)
    *H01S 5/14*     (2006.01)
    *H01S 5/32*     (2006.01)

(52) U.S. Cl.
    CPC ...... *H01S 5/18344* (2013.01); *H01S 5/18397* (2013.01); *H01S 5/3222* (2013.01); *H01S 5/426* (2013.01); *H01S 5/423* (2013.01); *H01S 2301/166* (2013.01); *H01S 2301/176* (2013.01)

(58) Field of Classification Search
    USPC .................................................. 372/50.124
    See application file for complete search history.

(56) References Cited

U.S. PATENT DOCUMENTS

2003/0185267 A1* 10/2003 Hwang ............... H01S 5/18358
                                                          372/96
2013/0075772 A1* 3/2013 Koda .................... H01S 5/2031
                                                          257/98

OTHER PUBLICATIONS

Fill M et al: "PbSe quantum well mid-infrared vertical external cavity surface emitting laser on Si-substrates". Journal of Applied Physics, American Institute of Physics. New York, US, vol. 109, No. 9, May 2, 2011 (May 2, 2011), pp. 93101-93101.
Chang-Hasnain C J et al: "Transverse Mode Characteristics of Vertical Cavity Surface-Emitting Lasers", Applied Physics Letters, AIP, American Institute of Physics. Melville. NY, US, vol. 57, No. 3, Jul. 16, 1990 (Jul. 16, 1990), pp. 218-220.
International Search Report and Written Opinion dated Aug. 1, 2014 for PCT/EP2014/059022.

* cited by examiner

LIGHT GUIDING FOR VERTICAL EXTERNAL CAVITY SURFACE EMITTING LASER

CROSS-REFERENCE TO RELATED APPLICATIONS

This application is a U.S. national stage application under 35 U.S.C. 371 of co-pending International Application No. PCT/EP2014/059022 filed on May 4, 2014 and entitled LIGHT GUIDING FOR VERTICAL EXTERNAL CAVITY SURFACE EMITTING LASER, which in turn claims priority to European Patent Application No. 13167055.6, filed on May 8, 2013, the contents of which are incorporated by reference herein in its entirety for all purposes.

TECHNICAL FIELD

The present invention relates to an active gain layer stack according to the preamble of claim 1 and to a laser device comprising two mirrors forming a cavity and said active gain layer stack. Moreover, the present invention relates to method of operation of said laser device and a method of fabrication of said active gain layer stack.

PRIOR ART

Semiconductor lasers for the mid-infrared are known since the 1970s. The original devices are edge emitters, pumped electrically in the form of a laser diode, have to be cooled cryogenically and depending on design emit in a spectral range from 2 micrometers to 20 micrometers wavelength. This range will in the following be called the "mid-IR" range. As semiconductor material, narrow gap IV-VI semiconductors like PbSnTe, PbEuTe, PbSrTe, where Te may be fully or partially replaced by Se or S in various compositions, were used. Later, III-V based lasers using semiconductors like GaAs, GaSb, InP or InSb and compounds thereof were developed for the mid-infrared, too. Again, these are typically laser diodes pumped electrically and edge-emitting. Wavelengths up to about 3.5 micrometers are reached. As an alternative, quantum and interband cascade laser diodes (QCL, ICL), again edge emitters, have proven to be useful. Their spectral range covers wavelengths from about 3 micrometers up to larger than 20 micrometers. QCL and ICL need a sophisticated layered structure, consisting of many hundreds of semiconductor layers grown monolithically on III-V substrates. Some of these designs operate up to room temperature and in continuous wave.

The disadvantage of edge emitting laser diodes is their strong astigmatic emission beam with a very high divergence angle, e.g. 60°, in one direction. To focus or collimate this beam to one with Gaussian-like shape, sophisticated and expensive optical elements are needed and a considerable part of the output power is lost. The large aperture in one direction is due to the very thin layers of the gain structure in order to keep a threshold current low.

Much is gained if the semiconductor laser emits vertically with respect to the surface. With a typical beam exit diameter of at least several to tens of micrometers, a narrow circular output cone results with an opening angle of a few degrees only. Such lasers exhibit a "good beam quality" emission in a quasi-perfect radial-symmetric Gaussian shape with very small divergence angles, e.g. below 2°, and with a beam quality factor $M^2$ approaching unity. Contrarily, the factor $M^2$ is much higher in edge emitting lasers. Such Vertical Cavity Surface Emitting Laser (VCSEL), also called semiconductor disk laser, are fabricated monolithically or, for higher powers, with an external cavity. The latter are consequently called Vertical External Cavity Surface Emitting Laser (VECSEL). VCSEL are often electrically pumped. In order to achieve sufficient high currents above threshold level, the current is guided through the active region using a so called buried tunnel junction. It is essentially an etched structure with a diameter of multiple micrometers which is later overgrown with the second mirror. In some cases of electrically pumped VECSEL an additional structuring on top of the active region is used to suppress higher order transversal modes by inducing losses. Optically pumped VECSEL have advantages in the construction to obtain high beam quality, low losses and high power. The diameter of a pumping spot needs to be aligned with a cavity mode spot and is in a range of few to multiple hundred micrometers. A curved external mirror can be used for better definition of the laser mode diameter, which depends on cavity length, mirror curvature, and emission mode order. VCSEL as well as VECSEL are commonly used e.g. for telecommunication applications. While VCSEL are limited to low power applications, very high powers have been reached with VECSEL.

For VECSEL based on III-V semiconductors, the longest laser mid-IR wavelengths are below 2.8 micrometers. VECSEL using IV-VI materials may, however, cover the whole mid-infrared range. Such devices were described in M. Fill, F. Felder, M. Rahim, A. Khiar, R. Rodriguez, H. Zogg, A. Ishida, IV-VI mid-infrared VECSEL on Si-substrate, Proc. SPIE, 82420H, 2012. IV-VI VECSEL are especially important for infrared spectroscopy, where a narrow, monochromatic and wavelength tunable illumination is required. Such a device is described in M. Rahim, A. Khiar, M. Fill, F. Felder, H. Zogg, Continuously tunable single mode VECSEL at 3.3 μm wavelength for spectroscopy, Electron. Lett. 47, 18, p. 1037-1039, 2011. The wavelength tuning range extends from about 3.2 to 3.3 micrometers. The beam is single mode monochromatic, and tuning is completely mode-hop free.

Such tunable VECSEL may be used in a whole range of different applications. One such application is, e.g., trace gas spectroscopy for environmental monitoring. Other applications include trace gas, gas, or liquid spectroscopy for industrial process control or medical diagnosis of severe diseases. Combustion gases and hydrocarbons have very strong absorption lines at mid-infrared wavelengths from 3 μm to 10 μm. Gas spectroscopy sensors therefore offer a very high sensitivity when operating within this wavelength region. By making the whole mid-infrared accessible, the mid-IR laser modules allow to harvest the full potential of spectroscopic sensors. Other applications include medical surgery (tissue cutting or healing), material processing, or military countermeasures. There are two transparency windows in the mid-infrared (3-5 μm and 8-14 μm), where atmospheric absorption is minimal. This allows reliable signal transmission over long distances, i.e. free space communications.

SUMMARY OF THE INVENTION

Current lasers based on IV-VI semiconductors cannot be operated efficiently. With IV-VI materials the temperature-dependence of the refractive index leads to a strong anti-guiding effect on the generated laser light. This temperature-dependence is a fundamental physical property and cannot be influenced. The anti-guiding effect results in a significantly increased lasing threshold. As a consequence, the devices cannot be operated at the desired high temperatures, require higher pumping power, or emit lower output power. Those aspects increase the complexity of the packaging, add unnecessary costs, and make the laser's use in an application more difficult and less reliable.

It is therefore an object of the present invention to provide an active gain layer stack that overcomes the aforementioned disadvantages and improves the wall-plug efficiency of vertical emitting lasers in particular based on IV-VI semiconductors, independently of whether they are electrically or optically pumped.

This and other objects are achieved by providing an active gain layer stack for a vertical emitting laser device, the active gain layer stack comprising a semiconductor material and being structured such that it forms at least one mesa extending in a vertical direction and a transversally neighboring region at least partly surrounding said mesa, wherein at least part of said mesa has a first refractive index and wherein a part of the neighboring region transversally adjacent to said part of the mesa has second refractive index, wherein said first refractive index is higher than said second refractive index, and wherein a diameter in transversal direction of said mesa is chosen such that a transversal confinement factor in the active gain layer stack is increased, wherein said semiconductor material has a refractive index that decreases with increasing temperature.

In other words, the diameter in transversal direction of said mesa is chosen such that a transversal confinement of the laser light in the active gain layer stack is increased.

The vertical direction is the direction substantially perpendicular to the active gain layer stack surface, i.e. the direction in which the laser light is emitted, whereas the transversal or horizontal direction is parallel to the active gain layer stack surface.

The term "mesa" is to be understood as a protrusion in vertical direction from a gain layer stack surface, from a mirror, or from a substrate, depending on the height (or depth) of the mesa. Said protrusion has a substantially flat distal surface and steep edges. The distal surface is the top surface of the mesa. A mesa may have a longitudinal cross section with a substantially rectangular or trapezoidal shape, wherein the distal surface in case of trapezoidal shape may be provided on the small or on the larger of the two parallel sides of the trapezoid. The mesa may also have a mushroom- or a pear-shaped cross section. Typical heights of a mesa are similar to the thickness of the active gain layer, or more e.g. in case of additional layers between the active gain layer and the substrate, and may even reach multiple micrometers into the substrate. Preferably, a plurality of mesas may be arranged in a preferably regular pattern on the gain layer stack surface, on the mirror, or on the substrate. If the mesa is provided on the substrate, the mesa preferably but not necessarily comprises a mirror layer opposite the distal surface of the mesa.

According to a preferred embodiment, said semiconductor material is a IV-VI semiconductor material, such as PbSnTe, PbEuTe, PbSrTe, where Te may be fully or partially replaced by Se or S. Preferred compositions of said materials consist i.e. of $Pb_{1-x}Sr_xTe$, where x is in the range of 0% up to 15%. Lead salts are preferred materials.

Preferably, the active gain layer stack or package comprises a semiconductor material having a first refractive index and forming on its surface at least one transversally thereon extending lasing spot. The lasing spot is preferably at least part of or the entire distal surface of the mesa. The gain layer stack further comprises a lasing spot region, given by the mesa body and preferably the active region extending below the mesa body. The gain layer stack further comprises a substrate on which the active region is provided on. The substrate provides support. The active lasing spot region extends with its height substantially vertical from said lasing spot into said active gain layer stack, wherein the lasing spot region includes said lasing spot, and wherein said semiconductor material is a IV-VI semiconductor material, wherein a first refractive index of at least a part of the lasing spot region is higher than a second refractive index of a neighboring region of the active gain layer stack transversally adjacent to and encompassing said part of the lasing spot region, thus increasing a transversal confinement factor in the active gain layer stack.

It is important to realize here, that the threshold gain required to operate a V(E)CSEL, and thus its energy efficiency, depends on the modal confinement factor, which has components in the horizontal plane. In the case of III-V materials, this confinement factor is close to unity thanks to a favorable temperature-dependence of the refractive index of the materials. Pumping the laser results in a temperature gradient and thus a refractive index gradient from a center of the emission spot outward occurs, resulting in a guiding structure for the laser light. The temperature-dependence when using IV-VI materials is, however, inverse and the refractive index increases with lower temperatures. In such an anti-guided structure the electric field diverges into the outer part where the refractive index is higher. The transverse confinement factor is by orders of magnitude smaller, resulting in a significantly increased lasing threshold and degraded device efficiency.

Said difference from the first to the second refractive index is present in particular during operation of the gain layer stack, i.e. while the active lasing spot region is at operation temperature. For a temperature gradient of 30° C. from the center of the lasing spot with maximum heating, the refractive index of $Pb_{0.95}Sr_{0.05}Te$ increases about 1% towards the rim of the lasing spot.

The active gain layer stack according to invention may be included in an active gain region of a vertical emitting laser (e.g. a VECSEL or a VCSEL).

The present invention achieves an advantageous light guiding effect by confining the lasing mode in horizontal, i.e. transversal, direction. Using etched or expitaxially grown structures or spatially differing material compositions or structures, the refractive index gradient or its spatial dependence is effectively inverted, with a high refractive index in the center of the active lasing spot region, in particular of the lasing spot and a low refractive index at the edge and outside of the active lasing spot region and the lasing spot, respectively. The laser mode is then concentrated spatially in the regime with high refractive index. This increased confinement factor significantly reduces the threshold power of the laser, resulting in a much improved power efficiency. Devices using this invention can be operated at higher temperatures and with a higher duty cycle or even continuously.

Using spatially defined lasing spots has additional advantages in the later implementation and adds to the lasing characteristics. Just a single lasing spot can be fabricated in order to accurately and uniquely define the position at which laser light is generated. This is of importance in applications where the light path needs to be known precisely, or for simplified optical alignment. Using multiple lasing spots in close proximity simultaneously for light generation yields a higher total output power. Furthermore, the lasing properties can be tuned, for example to achieve different emission wavelengths, by switching between different lasing spots.

The presented invention significantly advances the IV-VI laser technology by increasing the wall-plug efficiency and allowing different operation modes:

Due to the significantly increased efficiency, the devices can be built much smaller. No heat sink is necessary at all and uncooled operation is possible. This allows the successful use in applications in which even small amounts of waste heat are undesired. The stability of the whole system is improved, resulting in a more reliable integration.

New applications become possible due to the more versatile design possibilities regarding output power and an exact definition of the emission spot. Advanced devices allow a switching between different lasing regimes during operation.

Continuous wave emission becomes possible for operation close to room temperature, even in a simple setup using thermoelectric stabilization.

Preferably, the neighboring region of the active gain layer stack surrounding a mesa as described above includes at least one of:

a vacuum region, or a gas-filled region, or a liquid-filled region, or a solid region, wherein a material of said solid region has a lower refractive index than the refractive index of said part of the lasing spot region.

Vacuum and gas have a refractive index of about 1, resulting in a very large contrast of a factor of up to about 6 compared to the mesa itself. Liquids including water or solvents typically have a refractive index of about 1.3 to 1.5. In case of a solid region surrounding the mesa, the contrast of refractive index is much smaller depending on the material and the fabrication method used. Typical values range from multiple % for suited IV-VI material compositions up to a factor of 4 for silicon oxides.

As an example, the neighboring region may thus be in a first direction a solid material, wherein in a second direction perpendicular to the first direction it may be provided by a vacuum or a gas region.

According to a preferred embodiment of the invention, the neighboring region surrounds said mesa over substantially the entire vertically extending height of said mesa and preferably encircles said mesa transversally completely.

According to another preferred embodiment, the active gain layer stack as described above is structured such as to provide on its surface at least one vertically extending mesa, wherein each one mesa forms a lasing spot region with a lasing spot on its distal surface. The lasing spot region may extend further below the mesa into the active gain layer stack, preferably down to the substrate. Preferably, at least part of said substrate acts as a mirror.

It is to be understood, that a mesa may extends vertically into the direction pointing away from a substrate carrying the active gain layer package, or it may extend vertically into the direction pointing toward said substrate. In the former case, the neighboring region around the mesa may be filled with a desired material or pumped empty to a vacuum region. In the latter case, the neighboring region around the mesa may be the same basic material as the mesa is made from, wherein the material of the neighboring region is treated such as to have a lower refractive index, i.e. through ion implantation, irradiation or other techniques.

Preferably, the height of the lasing spot region, i.e. the mesa as described above, is substantially equal to or smaller than a height of the active gain layer stack. According to a preferred embodiment, the height of the lasing spot region or the mesa as described above extends substantially vertically down to a substrate, whereupon the active gain layer stack is directly or indirectly provided on. A vertical extension down to the substrate is particularly advantageous, if the active gain layer stack is manufactured by an etching process, as the substrate, typically made from silicon, may act as an etch stop.

In vertical direction, the mesa may have a rotational symmetry with the rotation axis pointing in vertical direction. The lateral surface or the edges of the mesa may, however, be undercut such that a mushroom-like shape results or it may be inclined, such that the lateral surface has a substantially cone- or pear-shaped form.

According to a preferred embodiment, the lasing spot region has a round cross section, wherein said round cross section is preferably of a substantially part-circular or circular shape, or wherein the lasing spot region has a cornered cross section.

A diameter of the lasing spot region or the lasing spot or the mesa in transversal direction is preferably in a range extending from 5 to 500 micrometers, in particular from 20 to 100 micrometers and in particular of about 40 micrometers. Realized devices consist of mesa with a height of about 1 micrometer and diameters of about 40 micrometers suited for a lasing spot size corresponding to a cavity length of about 60 micrometers.

Preferably, the diameter of the mesa is chosen such that higher order transversal modes are suppressed.

According to yet another preferred embodiment, the active gain layer stack has a plurality of individual of said lasing spot regions or mesas, wherein these individual lasing spot regions have the same or different emission characteristics.

It is another object of the present invention to provide a vertical emitting laser device with improved wall-plug efficiency.

This object is achieved by a vertical emitting laser device including a first mirror with at least one first mirror layer, with a second mirror with at least one second mirror layer forming an optical cavity with said first mirror, and with an active region between the first and the second mirror, characterized in that said active region includes at least one active gain layer stack as described above.

Preferably, the cavity formed by the two mirrors is arranged with a length in order that only one single longitudinal laser mode is emitted whose wavelength may be shifted mode-hop-free by altering the cavity length. Alternatively, the cavity length may be long, resulting in multimode emission or single-mode emission using an additional optical element within the cavity. The laser is fabricated using IV-VI materials and emits in the mid-infrared range of the electromagnetic spectrum. It preferably is optically pumped, but the presented invention is useful for electric pumping of the gain medium as well.

In a particularly preferred embodiment said active gain layer stack is provided on the first mirror, wherein a height of the mesa in vertical direction is equal to or at least 10% to 100% percent of a height of said active gain layer stack, i.e. the active gain layer is provided as individual mesas. More preferably said height of the mesa in vertical direction is larger than said height of said active gain layer stack, such that the mesa extends through or over the active gain layer stack into the first mirror. This means that each mesa comprises an active gain layer and a mirror.

In this case, the mesa layer closest to the substrate is a mirror layer, wherein the transversally neighboring part of the mesa mirror layer is part of the neighboring region as described above. Hence the mesa is provided on the remaining part of the mirror.

More preferably, the mesa extends in vertical direction through or over the entire active gain layer stack and first mirror onto or into a substrate whereupon the first mirror is provided on. In this case, the mesa comprises a mirror layer. The mesa can also extend into or comprise part of the substrate, such that the proximal mesa layer is made from substrate material.

Preferred embodiments of the active laser stack according to invention may be described in the following way. As a basic structure one has either (a) a substrate, on the surface of which the active gain layers are directly provided on, or (b) a substrate, whereupon a mirror is provided, wherein the active gain layers are provided on the surface of said mirror. Alternatively, one could say the active gain layer stack may not include a mirror layer (situation (a)) or may include a mesa mirror layer (situation (b)).

The mesa structure is worked into this basic structure (a) or (b) such that each mesa may include, in vertical direction:
(i) only a part of the active gain layers (i.e. mesa height smaller than active gain layer stack height, mesa is provided on the active gain layers);
(ii) the entire gain layers (i.e. mesa height substantially equal to active gain layer stack height; the mesa is provided on a substrate, which substrate can be a mirror);
(iii & iv) the entire gain layer stack, and, if no mirror is provided for (situation (a)), a part of the substrate or, if a mirror is provided (situation (b)), a part of said mirror;
(v) the entire gain layer stack and the entire mirror, if a mirror is provided for (situation (b));
(vi) the entire gain layer stack and the entire mirror and a part of the substrate, if a mirror is provided for (situation (b)).

The variants (i) to (vi) may be achieved by building up layer by layer (material deposition processes) or by removing layer by layer from the basic structure (e.g. etching processes) or by applying both these techniques.

If one produces the mesa by means of an etching technology, the etch stop may conveniently be chosen in the active gain layer stack, on or in the mirror layer, or on or in the substrate layer.

The mirror or the substrate in general can act as a natural etch stop layer, which makes the fabrication of the device simpler.

Preferably the laser device is constructed such that a diameter of the mesa in transversal direction is substantially equal to or slightly larger than a cavity mode spot size of a TEM00 mode.

The vertical emitting laser device may be used or operated by pumping one or at least one lasing spot region or mesa. This pumping may be an optical or an electrical pumping, wherein each distal surface of a pumped mesa forms an active lasing spot.

According to a preferred embodiment, a plurality of lasing spots regions is pumped simultaneously or consecutively. In case of substantially parallel mirror alignment, all lasing spots of one lasing area are lasing with comparable threshold, output powers, and wavelengths. In case of deviation from perfect parallelism, i.e. when a curved mirror is used, emission wavelengths are different for individual lasing spots. In both cases the efficiency gains presented in this invention can be fully utilized while multiplying the output power or achieving a broader emission spectrum or wavelength tuning range. In the latter case, Simultaneous emission of multiple lasing spots is achieved by simply pumping multiple lasing spot regions. For consecutive pumping the threshold power is exceeded only for one lasing spot region at a time, i.e. by moving the pumping light over individual spots.

Preferably, the vertical emitting laser device as mentioned above is operated by applying a switching between different lasing regimes during operation.

It is yet another object of the present invention to provide a method of manufacturing an active gain layer as described above.

This and other objects are achieved by a method of manufacturing of said active gain layer stack or said laser device, in that the active gain layer stack is manufactured by applying etching techniques or by applying epitaxial growth techniques.

Using this method, the laser device is manufactured on a wafer level or individually for a chip.

It is an aspect of the present invention to use a structured active region to effectively ensure a higher refractive index where lasing occurs and thus confine the laser mode to this spacial region in order to improve device efficiency. Due to material properties the invention is specific to lasers using IV-VI semiconductors in the active region, both optically and electrically pumped. While structuring of the active region has been used extensively for various reasons, to our best knowledge no etched structure has been designed to create a light guiding structure in the described context. Commonly used wave guides rely on total reflection at the interfaces, which is of no importance here.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Figure 1:
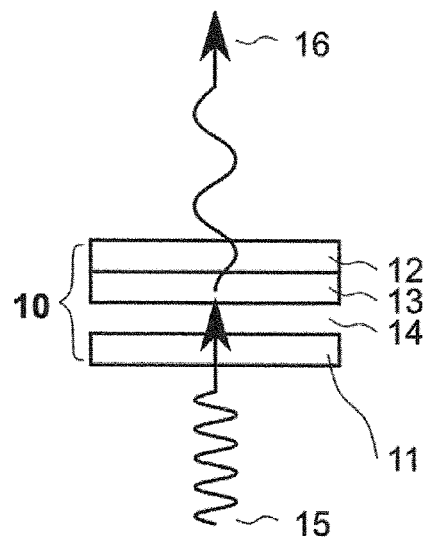
FIG. 1 shows a schematic sketch of a typical embodiment of the laser.

For the purposes of the present invention, a VECSEL-type laser device may be broadly defined as follows: A VECSEL-type laser is a surface-emitting semiconductor laser having a first ("bottom") mirror and a second ("top") mirror which is disposed at a distance from the first mirror, forming an optical cavity with the first mirror. An active region (gain medium) comprising at least one active semiconductor layer is disposed in the cavity, the semiconductor layer being oriented such that the resulting laser beam in the cavity will be substantially perpendicular to the layer plane. The active region may optionally comprise quantum wells or quantum dots. The active region contains regions (lasing area) fabricated in such a way, that the refractive index within this region remains higher than its surroundings during operation of the laser. The area where lasing is possible may be limited by macroscopic parts, such as a sample mount. The first and/or the second mirror serve as an output coupler for an output beam. The laser may be optically or electrically pumped.

The lasing spots are typically round, but other shapes may be chosen for different reasons including better heat flux, selection of one or more specific transversal modes, polarization selection of the emitted light, or passivation. Their size is chosen to be approximately at the minimum of threshold power. The lasing threshold decreases with smaller size and thus stronger confinement, but increases for to small diameters as additional losses are induced. The optimal size depends on multiple parameters of the cavity such as its optical length and the curvatures of the mirrors. With decreasing cavity length and increasing curvature the size becomes smaller, down to a few micrometers.

The manufacturing may be done on wafer level or individually for smaller chips. In both cases one or more lasing spots with uniform or individual properties are placed at the area where lasing will occur. Typically a symmetric repetitive arrangement of multiple lasing spots is chosen for each such lasing area. During epitaxial deposition of the light generating IV-VI semiconductors a shadow mask is used to structure the active region. The mask or a slightly larger one can also be used on any number of beforehand deposited layers, including partial layers and layers forming a mirror. Alternatively, lasing spots are etched after growth using standard lithography and etching techniques. The etch depth can be through any number of layers, including partial layers and layers forming a mirror, down to the substrate. The size of the etched structure can be slightly larger in the mirror layers. The low refractive material can be either using vacuum or any gas mixture including air. The space around the lasing spot can also be filled with other materials with a refractive index lower than the IV-VI semiconductors used in the active region, for example to improve the heat removal from the active region. In both cases, a passivation of the vertical walls of the lasing spot may be applied. The refractive index gradient structure may also be produced by changing the composition of the IV-VI semiconductor layers using ion implementation at selected areas.

Either flat or curved mirrors can be used. In case of flat mirrors, aligned substantially parallel, all lasing spots of one lasing area are lasing with comparable threshold, output powers, and wavelengths. In case of deviation from perfect parallelism, or when a curved mirror is used, emission wavelengths are different for individual lasing spots. In case of a curved mirror, lasing characteristics for the individual lasing spots differ, too. The lowest threshold is achieved for the one lasing spot where the mirror curvature aligns optimal with the laser cavity.

Figure 2:
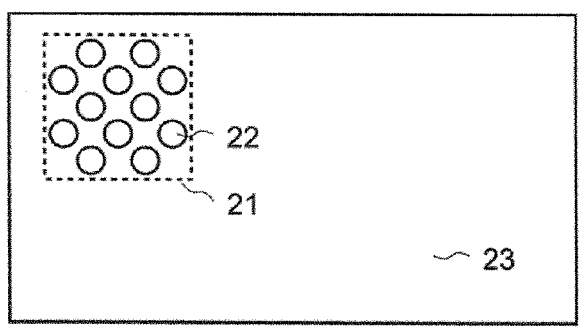
FIG. 2 shows a typical arrangement of lasing spots for a lasing area.

A first preferred embodiment of a VECSEL according to the present invention is schematically illustrated in FIGS. 1 and 2. It is to be noted that the dimensions are not to scale. In particular, the thickness of the individual parts of the laser along the vertical direction is strongly exaggerated in relation to the dimensions in the horizontal plane, in order to illustrate the sequence of layers in the laser device. A VECSEL 10 consisting of a first mirror 11, a second mirror 12 and a gain layer region 13, and an external cavity 14.

Figure 3:
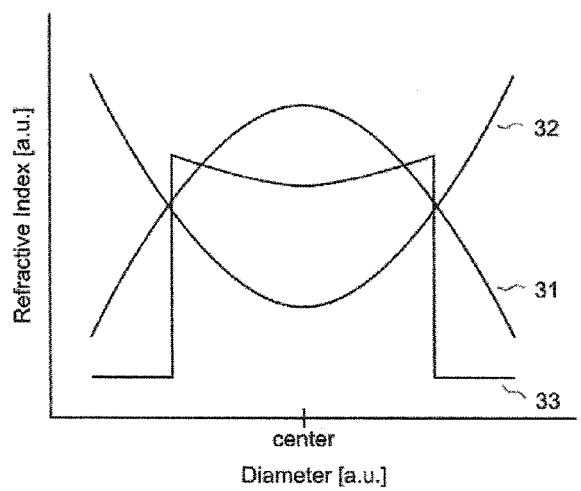
FIG. 3 shows the refractive index gradient for III-V and IV-VI semiconductor materials during a laser pulse.

The active gain layer region 13 is provided on the second mirror 12. It may alternatively be provided on the first mirror 11. The mirrors 11, 12 are highly reflective for the laser emission wavelength and are realized using well known technologies, e.g. metallic coatings or distributed Bragg reflectors on suitable substrates. The active region 13 consists of IV-VI semiconductor materials as commonly used in laser devices. It is structured with lasing spots 22 standing out of a surface 23, and grouped within the lasing area 31. The schematic refractive index profile over a lasing spot 22 and its close surroundings changes from a normal IV-VI gradient 32 to the induced profile 33, as shown in FIG. 3. Also shown in FIG. 3 is the refractive index gradient 31 for III-V semiconductor materials for comparison.

The layouts in FIGS. 1 and 2 are just examples. Either of the two mirrors may be flat (planar) or curved. As the spot diameter of the cavity mode on the active region is typically below about 0.1 mm, the lasing spot layout may be made very compact. In addition, a single lasing spot is sufficient for lasing. A total device size of below about 1×1×1 mm3 is possible.

Figure 5:
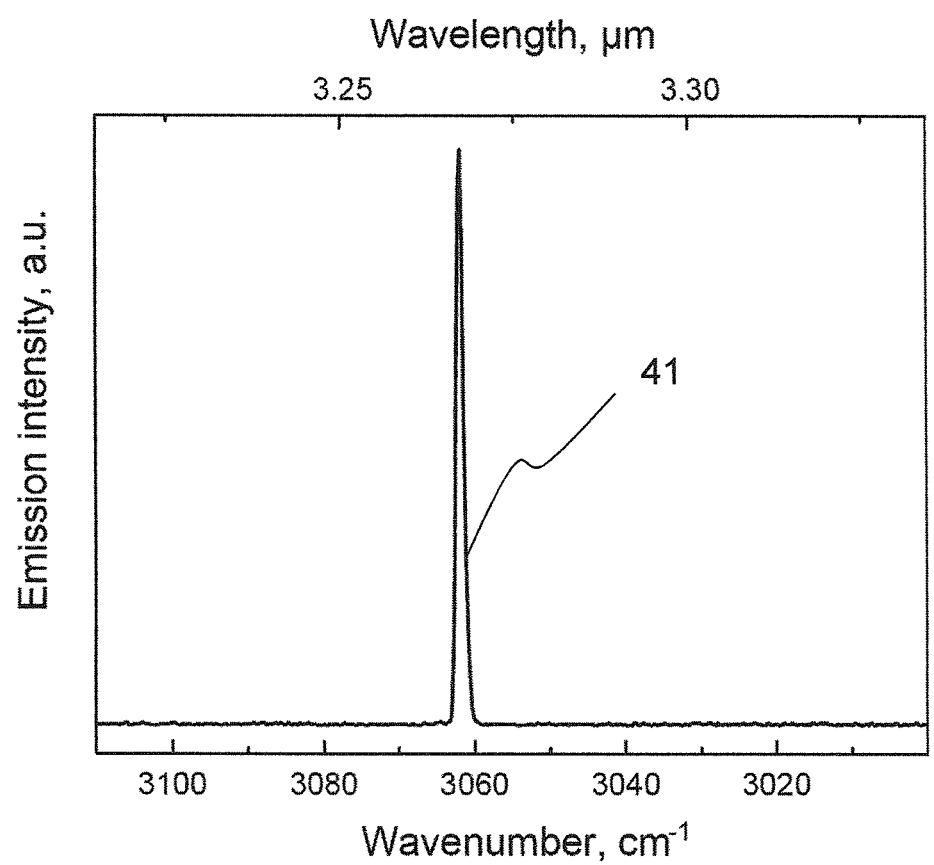
FIG. 5 shows a diagram containing an output spectrum of a VECSEL in accordance with the setup of the previous figures.

An example of a concrete set-up realized in the laboratory uses 5×5 mm$^2$ lasing area. The active region was grown epitaxially directly on the first mirror. The curved second mirror was positioned in approximately 50 micrometer distance. The lasing spots and lasing spot regions were created using wet etching. Lasing spot sizes or mesa diameters in transversal direction are the range of 5 to 500 micrometers, preferably sizes of about 40 micrometers were chosen, in relation to the mirror curvature of 100 mm and the cavity length. The device was optically pumped using a commercial 1.55 μm laser diode, operated in pulsed mode at 20 kHz repetition rate and with 10 ns pulse width, and recorded with a Fourier transform infrared spectrometer. Compared to devices without defined lasing spots, the threshold power is reduced at least by a factor of five. Peak output power is approximately 10 mWp, limited by the power of the pumping diode. The emission wavelength depends on operating temperature and cavity length. FIG. 5 shows an example of such laser emission spectrum 41.

Figure 4:
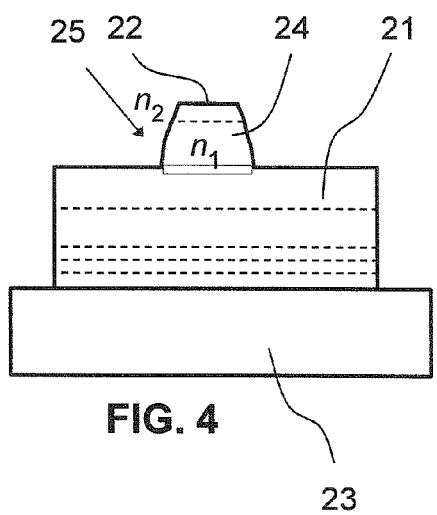
FIG. 4 shows a schematic sketch of a mesa provided on the active gain layer stack according to FIG. 2.

FIG. 4 shows a schematic sketch of a cross section of an active gain layer stack 21 with a mesa 24 extending in vertical direction (upwards direction in FIG. 4) and having a first refractive index $n_1$. A multi-layer structure is indicated by the broken lines. The distal surface 22 in vertical direction of the mesa 24 forms the lasing spot 22 during lasing action, i.e. if the mesa 24 is pumped. The mesa 24 is surrounded transversally completely by an adjacent neighboring region 25 with a lower second refractive index $n_2$, here a gas or vacuum. The difference of the refractive indices $n_1$ and $n_2$ at working temperature, i.e. while the mesa 24 is lasing, is such that a transversal confinement factor in the active gain layer stack 21 is enhanced in comparison to the situation, where the active gain layer stack 21 does not have a neighboring region with a lower refractive index $n_2$ as described above. The spatial variation of the refractive index follows the curve 33 in FIG. 3, where the jump continuities in curve 33 correspond to the transversal edge of the mesa 24. By having such a spatially varying refractive index, the mesa-structuring of gain layer stack 21 overcomes the disadvantage of the anti-guiding effect known from the state of the art. The active gain layer stack 21 is provided on a substrate 23 and well suited for use in a VECSEL or VCSEL.

Preferably, a plurality of mesas 24 are provided on the gain layer stack or package 21, wherein the plurality of mesas 24 is preferably arranged in a regular pattern with typical transversal distances (i.e. edge-to-edge clearance) between next neighboring mesas 24 in the order of a 1 micrometer up to 200 micrometers.

FIG. 5 shows an output spectrum of a VECSEL in accordance with the setup of the previous figures.

| LIST OF REFERENCE SIGNS | |
|---|---|
| 11 | first mirror |
| 12 | second mirror |
| 13 | active region |
| 14 | external cavity |
| 15 | pump laser light in |
| 16 | generated laser light out |
| 21 | active gain layer stack, possibly with mirror below |
| 22 | lasing spot |
| 23 | substrate |
| 24 | lasing spot region |
| 25 | neighbor region to 24 |
| 31 | Refractive index in III-V semiconductor materials during operation |
| 32 | Refractive index in IV-VI semiconductor materials during operation |
| 33 | Refractive index in IV-VI semiconductor materials during operation achieved by this invention |
| 41 | emission spectrum |
| $n_1$ | first refractive index |
| $n_2$ | second refractive index |

The invention claimed is:

1. An active gain layer stack for a vertical emitting laser device, the active gain layer stack comprising a semiconductor material,
   wherein the active gain layer stack is structured such that it forms at least one mesa extending in a vertical direction and a transversally neighboring region at least partly surrounding said mesa,
   wherein at least part of said mesa has a first refractive index ($n_1$) and wherein a part of the neighboring region transversally adjacent to said part of the mesa has a second refractive index ($n_2$),
   wherein said first refractive index ($n_1$) is higher than said second refractive index ($n_2$),
   wherein a diameter in a transversal direction of said mesa is chosen such that transversal confinement of laser light in the active gain layer stack is increased,
   wherein said semiconductor material has the refractive index ($n_1$) that decreases with increasing temperature, and
   wherein said neighboring region comprises at least one of a vacuum region, a gas-filled region, and a liquid-filled region.

2. The active gain layer stack according to claim 1, wherein the semiconductor material is a IV-VI semiconductor material.

3. The active gain layer stack according to claim 1, wherein the neighboring region surrounds said mesa over substantially the entire vertically extending height of said mesa, and preferably encircles said mesa transversally completely.

4. The active gain layer stack according to claim 1, wherein the vertically extending height of the mesa is substantially equal to or smaller than a height of the active gain layer stack.

5. The active gain layer stack according to claim 1, wherein the active gain layer stack includes a substrate, wherein the vertically extending height of the mesa extends substantially down onto or into said substrate, wherein preferably, at least part of said substrate acts as a mirror.

6. The active gain layer stack according to claim 1, wherein the diameter of the mesa in transversal direction is in a range extending from 5 to 500 micrometers.

7. The active gain layer stack according to claim 1, wherein the active gain layer stack has a plurality of individual said mesas, wherein these individual mesas have the same or different emission characteristics.

8. A method of manufacturing of the active gain layer stack according to claim 1, wherein the active gain layer stack is manufactured by applying etching techniques or by locally changing the material properties after epitaxial growth.

9. A vertical emitting laser device including a first mirror with at least one first mirror layer, a second mirror with at least one second mirror layer forming an optical cavity with said first mirror, and an active region between the first and the second mirror,
   wherein said active region includes at least one active gain layer stack comprising a semiconductor material,
   wherein the active gain layer stack is structured such that it forms at least one mesa extending in a vertical direction and a transversally neighboring region at least partly surrounding said mesa,
   wherein at least part of said mesa has a first refractive index ($n_1$) and wherein a part of the neighboring region transversally adjacent to said part of the mesa has a second refractive index ($n_2$),
   wherein said first refractive index ($n_1$) is higher than said second refractive index ($n_2$),
   wherein a diameter in a transversal direction of said mesa is chosen such that transversal confinement of laser light in the active gain layer stack is increased,
   wherein said semiconductor material has the refractive index ($n_1$) that decreases with increasing temperature, and
   wherein said neighboring region comprises at least one of a vacuum region, a gas-filled region, and a liquid-filled region.

10. The vertical emitting laser device according to claim 9, wherein said active gain layer stack is provided on the first mirror, wherein a height of the mesa in vertical direction is at least 10% to 100% percent of a height of said active gain layer stack, wherein preferably said height of the mesa in vertical direction is larger than said height of the active gain layer stack, such that the mesa extends over the height of the active gain layer stack into the first mirror, such that the mesa comprises a mirror layer, wherein more preferably, the mesa extends in vertical direction over the entire height of the active gain layer stack and the first mirror onto or into a substrate whereupon the first mirror is provided on, such that the mesa comprises the gain layer stack and a mirror layer or it comprises the gain layer stack, a mirror layer, and a substrate layer.

11. The vertical emitting laser device according to claim 9, wherein a diameter of the mesa in transversal direction is substantially equal to a cavity mode spot size of a TEM00 mode.

12. The method of manufacturing according to claim 8, wherein the diameter and form of the mesa is chosen such that only selected transversal modes are lasing.

13. A method of operation of the vertical emitting laser device according to claim 9, wherein said laser device is operated by pumping one or at least one mesa, wherein each distal surface of a pumped mesa forms an active lasing spot.

14. The method of operation according to claim 13, wherein a plurality of mesas is pumped simultaneously or consecutively, and/or wherein the vertical emitting laser device is operated by applying a switching between different lasing regimes during operation.

* * * * *